United States Patent
Tsuji

(10) Patent No.: US 8,878,153 B2
(45) Date of Patent: Nov. 4, 2014

(54) VARIABLE RESISTANCE ELEMENT HAVING GRADIENT OF DIFFUSION COEFFICIENT OF ION CONDUCTING LAYER

(75) Inventor: Yukihide Tsuji, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/514,385

(22) PCT Filed: Dec. 6, 2010

(86) PCT No.: PCT/JP2010/071811
§ 371 (c)(1),
(2), (4) Date: Jun. 7, 2012

(87) PCT Pub. No.: WO2011/071009
PCT Pub. Date: Jun. 16, 2011

(65) Prior Publication Data
US 2012/0241709 A1    Sep. 27, 2012

(30) Foreign Application Priority Data
Dec. 8, 2009 (JP) .................. 2009-278446

(51) Int. Cl.
*H01L 29/02* (2006.01)
*H01L 27/10* (2006.01)
*H01L 45/00* (2006.01)

(52) U.S. Cl.
CPC .......... *H01L 27/101* (2013.01); *H01L 45/1641* (2013.01); *H01L 45/146* (2013.01); *H01L 45/145* (2013.01); *H01L 45/1266* (2013.01); *H01L 45/1233* (2013.01); *H01L 45/085* (2013.01); *H01L 45/1625* (2013.01)
USPC ................. 257/2; 257/3; 257/4; 257/E47.001; 257/E47.005; 438/104

(58) Field of Classification Search
USPC ........ 257/2, 3, 4, E47.001, E47.005; 438/104
See application file for complete search history.

(56) References Cited

U.S. PATENT DOCUMENTS 6,855,975 B2 * 2/2005 Gilton ............................ 257/296
6,864,500 B2 * 3/2005 Gilton ................................ 257/2
(Continued)

FOREIGN PATENT DOCUMENTS

JP    2005-217422 A    8/2005
JP    2006-319028 A    11/2006
(Continued)

OTHER PUBLICATIONS

Shunichi Kaeriyama et al., "A Nonvolatile Programmable Solid-Electrolyte Nanometer Switch", IEEE Journal of Solid-State Circuits, Jan. 2005, pp. 168-176, vol. 40, No. 1.

(Continued)

*Primary Examiner* — Caleb Henry
(74) *Attorney, Agent, or Firm* — Sughrue Mion, PLLC

(57) ABSTRACT

A structure for a variable-resistance element using an electrochemical reaction. The structure limits a position at which metal cross-linking breaks to a position most preferred for cross-linking break: namely, a part of an ion conduction layer closest to a first electrode. Also provided is a method for manufacturing the variable-resistance element, which has a first electrode serving as a source for a metal ion(s), a second electrode which is less ionizable (i.e. has a higher redox potential) than the first electrode, and an ion conduction layer which is interposed between the first and second electrodes and can conduct the metal ion(s). There is a first region in the ion conduction layer, adjacent to the first electrode, having a diffusion coefficient that increases continuously towards the first electrode right upto contacting the first electrode.

10 Claims, 11 Drawing Sheets

(56) References Cited

U.S. PATENT DOCUMENTS

| | | | |
|---|---|---|---|
| 6,927,411 B2* | 8/2005 | Kozicki | 257/4 |
| 6,930,909 B2* | 8/2005 | Moore et al. | 365/148 |
| 6,972,427 B2* | 12/2005 | Roehr et al. | 257/2 |
| 7,006,376 B2* | 2/2006 | Kozicki | 365/185.01 |
| 7,132,675 B2* | 11/2006 | Gilton | 257/3 |
| 7,288,781 B2* | 10/2007 | Kozicki | 257/4 |
| 7,372,065 B2* | 5/2008 | Kozicki et al. | 257/4 |
| 7,385,219 B2* | 6/2008 | Kozicki et al. | 257/4 |
| 7,414,257 B2* | 8/2008 | Happ et al. | 257/2 |
| 7,531,823 B2* | 5/2009 | Tanikawa | 257/2 |
| 7,560,722 B2* | 7/2009 | Kozicki | 257/4 |
| 7,728,322 B2* | 6/2010 | Kozicki | 257/4 |
| 7,732,799 B2* | 6/2010 | Lee et al. | 257/4 |
| 7,759,771 B2* | 7/2010 | Lee et al. | 257/537 |
| 7,838,341 B2* | 11/2010 | Dennison | 438/128 |
| 7,897,955 B2* | 3/2011 | Jin et al. | 257/2 |
| 7,960,712 B2* | 6/2011 | Sakamoto et al. | 257/4 |
| 8,003,971 B2* | 8/2011 | Happ et al. | 257/3 |
| 8,022,384 B2* | 9/2011 | Kozicki | 257/4 |
| 8,203,133 B2* | 6/2012 | Sakamoto et al. | 257/3 |
| 8,466,461 B2* | 6/2013 | Seo et al. | 257/43 |
| 2007/0285148 A1 | 12/2007 | Sakamoto et al. | |
| 2008/0001137 A1* | 1/2008 | Kozicki et al. | 257/4 |
| 2008/0006812 A1* | 1/2008 | Kozicki et al. | 257/4 |
| 2008/0007995 A1* | 1/2008 | Schwerin | 365/163 |
| 2008/0087635 A1* | 4/2008 | Hwang et al. | 216/41 |
| 2008/0237567 A1* | 10/2008 | Kozicki | 257/4 |
| 2008/0272360 A1* | 11/2008 | Kozicki | 257/4 |
| 2009/0014770 A1* | 1/2009 | Terao et al. | 257/314 |
| 2009/0152526 A1* | 6/2009 | Courtade et al. | 257/4 |
| 2009/0237983 A1* | 9/2009 | Happ et al. | 365/163 |
| 2009/0283740 A1* | 11/2009 | Kozicki et al. | 257/4 |
| 2009/0309088 A1* | 12/2009 | Sakamoto | 257/2 |
| 2010/0133501 A1* | 6/2010 | Sakamoto et al. | 257/4 |

FOREIGN PATENT DOCUMENTS

| | | |
|---|---|---|
| JP | 2009-21431 A | 1/2009 |
| JP | 2009-88144 A | 4/2009 |
| JP | 2009-105383 A | 5/2009 |
| JP | 2009-130344 A | 6/2009 |
| WO | 2006/070773 A1 | 7/2006 |
| WO | 2007/114099 A1 | 10/2007 |
| WO | 2008/068992 A1 | 6/2008 |
| WO | 2010/079829 A1 | 7/2010 |

OTHER PUBLICATIONS

T. Sakamoto et al., "Nonvolatile solid-electrolyte switch embedded into Cu interconnect", 2009 Symposium on VLSI Technology Digest of Technical Papers, 2009, pp. 130-131.

International Search Report for PCT/JP2010/071811 dated Feb. 15, 2011.

Communication dated Feb. 12, 2014, issued by the Japanese Patent Office in corresponding Application No. 2011-545199.

* cited by examiner (a)  (b)

(c)

VARIABLE RESISTANCE ELEMENT HAVING GRADIENT OF DIFFUSION COEFFICIENT OF ION CONDUCTING LAYER

CROSS-REFERENCE TO RELATED APPLICATIONS

This application is based upon and claims the benefit of the priority of Japanese patent application No. 2009-278446, filed on Dec. 8, 2009, the disclosure of which is incorporated herein in its entirety by reference thereto.

TECHNICAL FIELD

The present invention relates to a variable resistance element that is used for a programmable logic or memory and manufacturing method thereof and, in particular, relates to a variable resistance element using an electrochemical reaction and manufacturing method thereof.

BACKGROUND

As a memory element or a nonvolatile switching element for a programmable logic that is capable of changing a circuit structure of a semiconductor device, a variable resistance element using metal ion migration in an ion conducting material (an solid of which an ion can freely move around in an interior) and an electrochemical reaction is disclosed (Non-Patent Document 1). This variable resistance element has a three-layered structure having a first electrode 11 capable of supplying a metal ion, an ion conducting layer 20 in which the metal ion can conduct and a second electrode 12 which is less ionizable than the first electrode 11, as schematically illustrated FIG. 1.

In the variable resistance element disclosed in Non-Patent Document 1, a copper ion is used as the metal ion, copper is used as the first electrode 11 which serves as a source of supply for the copper ion, a metal oxide layer such as tantalum oxide is used as the ion conducting layer 20, and platinum is used as the second electrode 12 which is less ionizable. The variable resistance element using the electrochemical reaction has characteristics of a small size and a large ratio of resistance between an on state and an off state.

FIG. 2A shows a schematic diagram illustrating an operation of the variable resistance element and FIG. 2B shows a current-voltage graph. The above variable resistance element is in an off state that has high resistance just after the manufacturing. For transition from the off state to an on state that has low resistance, as illustrated in (a) of FIGS. 2A and 2B, the first electrode 11 is connected to the ground, negative voltage is applied to the second electrode 12, and metal ions are generated from the metal of the first electrode 11 by the electrochemical reaction and dissolved in the ion conducting layer 20. The metal ions 13 in the ion conducting layer 20 is precipitated as a metal on the surface of the second electrode 12. As illustrated in (b) of FIGS. 2A and 2B, the precipitated metal forms a metal bridge between the first electrode 11 and the second electrode 12 and electrically connects the first electrode 11 with the second electrode 12 (makes the transition to the on state). On the other hand, for transition from the on state to the off state, as illustrated in (c) of FIGS. 2A and 2B, the first electrode 11 is connected to the ground, and positive voltage is applied to the second electrode 12. As illustrated in (d) of FIGS. 2A and 2B, this breaks a part of the metal bridge and makes the transition to the off state.

Patent Document 1:
Japanese Patent Kokai Publication No. JP2006-319028A

Non-Patent Document 1:
Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

Non-Patent Document 2:
Toshitsugu Sakamoto et al., "Nonvolatile solid-electrolyte switch embedded into Cu interconnect", 2009 Symposium on VLSI Technology Digest of Technical Papers, pp. 130-131, 2009.

SUMMARY

The disclosures of the above mentioned Patent Document 1 and Non-Patent Documents 1 and 2 are incorporated herein by reference thereto in their entirety.

The following analysis is made in view of the present invention.

In the above mentioned variable resistance element, variation in positions where the bridged metal is broken on the transition from the on state to the off state arises among the switching cycles. As illustrated in FIGS. 3A-3C, when, after a part of the metal bridge is broken as from the low resistance state FIGS. 3A to 3B, the first electrode 11 is connected to the ground and the positive voltage goes on being applied to the second electrode 12, if the position where the metal bridge is broken is near the second electrode 12, a recoverable part 15 illustrated in FIG. 3B becomes smaller, and then a greater part of the metal bridge remains in the ion conducting layer (tantalum oxide) 20 after the metal bridge is recovered as illustrated in FIG. 3C. Therefore, insulating resistance between the first electrode and the second electrode is deteriorated (Non-Patent Document 2).

As a method of controlling the position where the bridged metal is broken, as illustrated in FIGS. 4A-4C, there is a method in which two ion conducting layers 21 and 22 are provided which are different in ion conductivities (or ion diffusion coefficients) between the first electrode 11 and the second electrode 12, as illustrated in FIGS. 4A-4C, the metal bridge 14 is broken near the first electrode 11 side by disposing the ion conducting layer 21, which has the larger ion diffusion coefficient, on the first electrode 11 side, and therefore the insulating resistance on the switching is improved (Non-Patent Document 2). As illustrated in FIG. 5, however, there remains uncertainty that the position where the bridge is broken is unclear in the ion conducting layer 21 (thickness T) which is adjacent to the first electrode 11. The reason is that a position which has the maximum diffusion coefficient D is spread spatially.

The present invention provides a variable resistance element using the electrochemical reaction and a method manufacturing thereof, the structure of the variable resistance element limiting a position where the metal bridge is broken to only a position closest to a first electrode of an ion conducting layer, which is the most desired position to be broken.

In a first aspect, a variable resistance element according to the present invention comprises: a first electrode that serves as a source of a metal ion(s); a second electrode that is less ionizable (that is, higher oxidation-reduction potential) than the first electrode; and an ion conducting layer that is disposed between the first electrode and the second electrode and is capable of conducting the metal ion(s). The ion conducting layer includes a first region which has a first diffusion coefficient successively increasing toward the first electrode upto contacting the first electrode and which is disposed adjacent to the first electrode.

In a second aspect, a method of manufacturing a variable resistance element according to the present invention is provided, the variable resistance element comprising: a first electrode that serves as a source of a metal ion(s); a second electrode that is less ionizable (that is, higher oxidation-reduction potential) than the first electrode; and an ion conducting layer that is disposed between the first electrode and the second electrode and is capable of conducting the metal ion(s). The method comprises forming the ion conducting layer composed of metal oxide or metal oxynitride; and applying plasma treatment to the ion conducting layer so as to vary oxygen concentration or nitrogen concentration of the ion conducting layer in a vertical direction of the layer, that is, in a direction across the first electrode and the second electrode.

In a third aspect, a method of manufacturing a variable resistance element according to the present invention is provided, the variable resistance element comprising: a first electrode that serves as a source of a metal ion(s); a second electrode that is less ionizable than the first electrode; and an ion conducting layer, composed of metal oxide or metal oxynitride, that is disposed between the first electrode and the second electrode and is capable of conducting the metal ion(s). The method comprises: forming the ion conducting layer in which silicon concentration is varied in a vertical direction of a layer, that is, in a direction across the first electrode and the second electrode, by co-sputtering so as to vary a ratio of ingredients supplied from a target of metal oxide or metal oxynitride and a target of a silicon compound(s).

In a fourth aspect, a method of manufacturing a variable resistance element according to the present invention is provided, the variable resistance element comprising: a first electrode that serves as a source of a metal ion; a second electrode that is less ionizable than the first electrode; and an ion conducting layer, composed of metal oxide, that is disposed between the first electrode and the second electrode and is capable of conducting the metal ion(s). The method comprises: forming the ion conducting layer in which oxygen concentration in metal oxide of the ion conducting layer is varied in a vertical direction of the layer, that is, in a direction across the first electrode and the second electrode, by sputtering while changing oxygen concentration in a device of sputtering a target of the metal oxide.

In a fifth aspect, a method of manufacturing a variable resistance element according to the present invention is provided, the variable resistance element comprising: a first electrode that serves as a source of a metal ion(s); a second electrode that is less ionizable than the first electrode; and an ion conducting layer, composed of metal oxynitride, that is disposed between the first electrode and the second electrode and is capable of conducting the metal ion(s). The method comprises: forming the ion conducting layer in which a concentration ratio of oxygen and nitrogen in metal oxynitride of the ion conducting layer is varied in a vertical direction of the layer, that is, in a direction across the first electrode and the second electrode, by sputtering while changing a concentration ratio of oxygen and nitrogen in a device of sputtering a target of metal oxynitride.

In a sixth aspect, an operation method for the variable resistance element according to the present invention is provided, an operation of transition from a high resistance state to a low resistance state is performed in a temperature range in which the ion conducting layer has a first gradient of the diffusion coefficient on the first side adjacent to the first electrode greater than a second gradient of the diffusion coefficient on the second side adjacent to the second electrode.

The present invention can achieve the following effect. The present invention can achieve a variable resistance element that limits a position where a bridge is broken only to a part, closest to a first electrode, of an ion conducting layer, which is the most desirable position to be broken.

That is, only the maximum point of the diffusion coefficient in the ion conducting layer is determined in a layer-depth direction of the ion conducting layer and the position coincides with a position at which the ion conducting layer is in contact with the first electrode (FIG. 6). The position where the bridged metal is broken on the transition from the on state to the off state can be limited to the part, closest to the first electrode, of the ion conducting layer, which is a most desirable position as the broken position, and the variation of the off state and deterioration of the insulating resistance can be restrained compared to the conventional structure illustrated in FIG. 5.

PREFERRED MODES

In the first aspect, it is preferred that the ion conducting layer further includes a second region which has a second diffusion coefficient that is constant; the second region is formed between the first region and the second electrode; and the second diffusion coefficient in the second region is equal to or less than the minimum value of the first diffusion coefficient in the first region. That is, the diffusion coefficient at the point where the first region and the second region are joined to each other continuously changes or, if discrete (or separated), increases stepwise from the second region to the first region It is preferred that the ion conducting layer has a compound (s) including two or more elements; and the first region having a gradient of the first diffusion coefficient is formed by varying a composition ratio of the two or more elements in a vertical direction of the layer, that is, in a direction across (or transverse between) the first electrode and the second electrode.

It is preferred that the compound(s) including two or more elements is composed of a metal(s), and nitrogen and/or a chalcogen element(s) that belongs to group 16 of a periodic table.

It is preferred that the ion conducting layer comprises metal oxide or metal oxynitride.

It is preferred that the ion conducting layer comprises tantalum oxide or tantalum oxynitride.

It is preferred that the ion conducting layer includes impurity; and the first region having a gradient of the first diffusion coefficient is formed by varying an amount of the impurity in a vertical direction of a layer, that is, in a direction across the first electrode and the second electrode.

It is preferred that the ion conducting layer comprises tantalum oxide or tantalum oxynitride including silicon as the impurity.

It is preferred that the ion conducting layer has a first temperature dependence of the diffusion coefficient on a first side adjacent (or directed) to the first electrode greater than a second temperature dependence of the diffusion coefficient on a second side adjacent (or directed) to the second electrode.

In the second aspect, it is preferred that the ion conducting layer is formed adjacent to the first electrode.

It is preferred that metal oxide or metal oxynitride is tantalum oxide or tantalum oxynitride.

One exemplary embodiment of a variable resistance element according to the present invention is described below.

Figure 6:
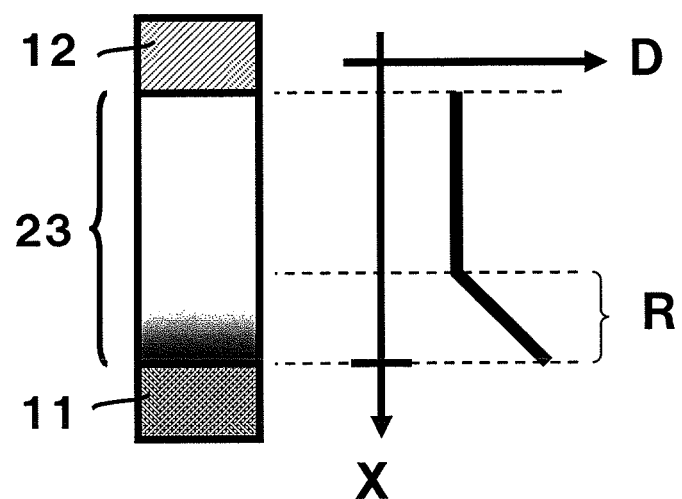
FIG. 6 is a schematic diagram of a structure of a variable resistance element according to one exemplary embodiment of the present invention.

FIG. 6 illustrates a cross-sectional diagram of a variable resistance element according to an exemplary embodiment of the present invention and change of a diffusion coefficient (D) in a thickness direction X of an ion conducting layer (i.e., in a direction across two electrodes). As illustrated in FIG. 6, the variable resistance element comprises a first electrode 11 that serves as a source of a metal ion(s), a second electrode 12 that is less ionizable than the first electrode 11, and an ion conducting layer 23 that is disposed between the first electrode 11 and the second electrode 12 and that is capable of conducting the metal ion. In the ion conducting layer 23, the closer to the first electrode 11, the more a diffusion coefficient of a first region R adjacent to the first electrode 11 successively increases upto reaching the first electrode 11. That is, the position having the maximum diffusion coefficient D is determined only at the closest position to the first electrode 11. It is sufficient that the diffusion coefficient changes in the thickness direction at a certain temperature(s), and the temperature that makes a difference between the diffusion coefficients may be high temperature or low temperature other than a practical application temperature (−40 Celsius degrees to 85 Celsius degrees). Although the region R in which the diffusion coefficient changes is a part of the ion conducting layer 23 in FIG. 6, it goes without saying that the entire of the ion conducting layer 23 may be the region in which the diffusion coefficient changes.

It is preferred that, as the first electrode 11, a metal or alloy having a main material of at least any one of Cu, Ag and Pb is used in order to supply the ion(s) to the ion conducting layer 23. In particular, it is preferred that the main material is Cu in view of compatibility with a semiconductor process. The metal or alloy may be present in at least a part of a surface, which is in contact with the ion conducting layer 23, of the first electrode 11. Accordingly, in addition of a method of forming the entire of the first electrode 11 as a single layer, the first electrode 11 may be formed as a layered (laminate) structure having Cu as the layer that is in contact with the ion conducting layer 23. The contact surface with the ion conducting layer 23 may be formed as a composite surface including a metal capable of supplying the ion, such as Cu, and other metal incapable of supplying the ion.

As the second electrode 12, the conductive material that is hard to receive the metal ion from the ion conducting layer 23 is used. Concretely, a high melting point material such as platinum, aluminum, gold, titanium, tungsten, vanadium, niobium, tantalum, chromium or molybdenum, nitride of at least any one of these metals, silicide of at least any one of these metals, or an alloy of a combination of a plurality of metals among these metals is preferred.

It is sufficient for the second electrode 12 that a surface of the second electrode 12, which is in contact with at least the ion conducting layer 23, is formed of the above material. Accordingly, in addition of a method of forming the entire of the second electrode 12 as a single layer, the second electrode 12 may be formed as a layered (laminate) structure in which the layer that is in contact with the ion conducting layer 23 is formed of the above material.

It is preferred that a material of the ion conducting layer 23 is any compound of metal and chalcogen element(s), including oxygen, sulfur, selenium and tellurium, or nitrogen. Any sulfide, oxide and oxysulfide having any ratio of sulfur to oxygen which include at least any one of copper, tungsten, tantalum, molybdenum, chromium, titanium and cobalt in the periodic table of elements are particularly preferred. Any metal oxynitride having any ratio of oxygen to nitrogen is also preferred. Any material in which an impurity (or impurities) such as silicon is added to metal may be allowed.

If the mounting in the semiconductor device is taken into consideration, metal oxides, in particular, tantalum oxide ($Ta_2O_5$) or titanium oxide ($TiO_2$), are preferred. Two reasons are given for it. One reason is that the materials have high compatibility of process because the materials have been used in a conventional semiconductor device. The other reason is that, if the variable resistance element is considered as a switching element for a reconfiguration circuit, it is possible to make a switching voltage higher than a logic voltage when the metal oxide is used as the ion conducting layer 23. In addition, the materials have high resistance against repeat of operations and therefore can ensure high reliability.

In order to change the diffusion coefficient in the ion conducting layer 23, a different element (impurity) from the elements making up the ion conducting layer 23 which is a fundamental body may be added. If Si is used as an additional impurity for tantalum oxide ($Ta_2O_5$), the closer to the first electrode 11, the more the diffusion coefficient can be increased by reducing a Si concentration in the ion conducting layer 23. When the ion conducting layer is composed of two or more elements, the diffusion coefficient can be changed by changing a composition ratio of the elements.

When the ion conducting layer is made of the metal oxide, an oxygen concentration (a composition ratio of oxygen to metal) can be changed in a layered direction. When the ion conducting layer is made of the metal oxynitride, the composition ratio of oxygen to nitrogen may be changed in the layered direction.

It is possible to set the layer thickness of the ion conducting layer within a range of 5 nm to 200 nm and, in particular, it is preferred to set the layer thickness of the ion conducting layer within a range of 10 nm to 100 nm. If the layer has a thickness of 10 nm or less, a leak current is easy to occur at an off time because of a tunneling current and a Schottky current. On the other hand, if the layer has a thickness of 100 nm or less, application to the semiconductor device and the like becomes difficult because of 10V or more of the switching voltage. The region where the diffusion coefficient changes is unnecessary to be the entire ion conducting layer, and the diffusion coefficient may be constant in a partial region of the ion conducting layer 23 which is in contact with the second electrode 12 as illustrated in FIG. 6.

Next, a method of manufacturing the variable resistance element according to one exemplary embodiment of the present invention will be explained. The ion conducting layer in which the composition ratio of the elements is varied in the layered direction or in which the additive amount of the impurity is varied in the layered direction may be made on a process of forming the ion conducting layer or on another process after forming the ion conducting layer.

When the composition ratio of the elements is changed in the layered direction on the process of forming the ion conducting layer, a source for each element may be individually provided in a device of the forming the layer and each supplying amount to a deposition surface may be adjusted corresponding to the deposition. The method of forming the layer is not limited and MBE (Molecular Beam Epitaxy), CVD (Chemical Vapor Deposition), co-sputtering, reactive sputtering and the like may be used.

When the impurity is added or when the composition ratio of the elements is changed after the uniform ion conducting layer is formed, interdiffusion by applying heat after layering of the ion conducting layers having different materials, ion injection, plasma oxidizing/nitriding and the like may be used. When post-treatment is applied to the ion conducting layer 23 on the first electrode 11, an effect that operation voltage of a first setting operation (forming operation) after the manufacturing is lowered can be also obtained.

Operation temperature of the variable resistance element is not limited and, if a temperature acceleration factor of the diffusion coefficient differs in the layered direction, it is preferred that rewriting is performed at a temperature at which a gradient of the diffusion coefficient becomes large in the layered direction.

Figure 1:
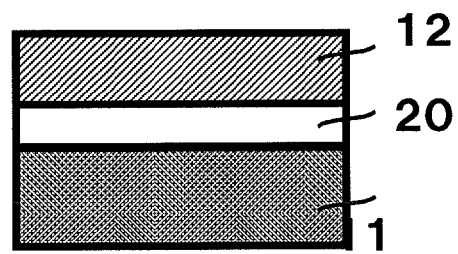
FIG. 1 is a cross-sectional diagram illustrating a basic structure of a variable resistance element.
Figure 2A:
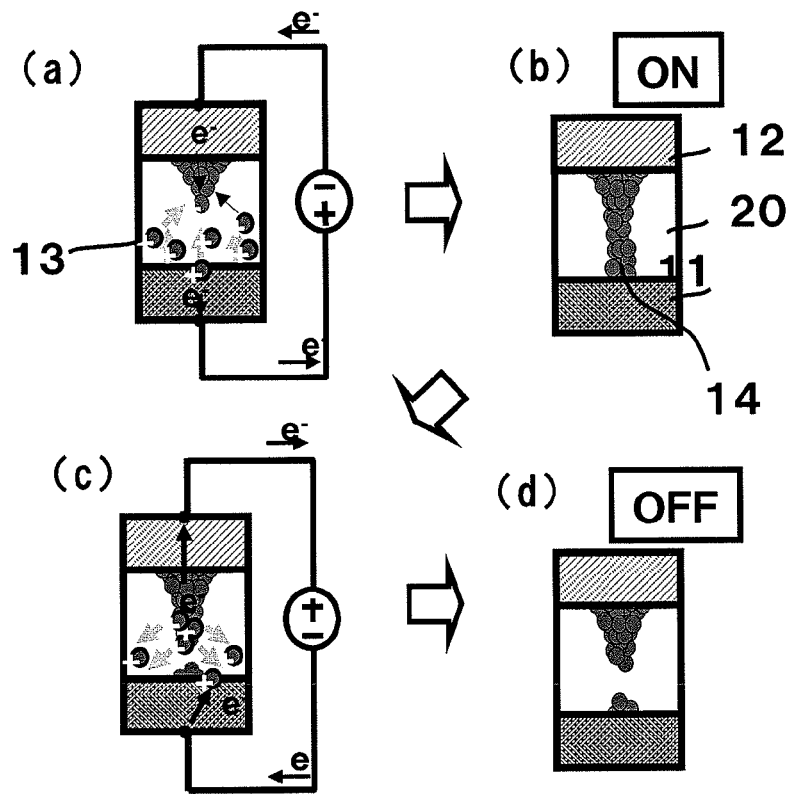
FIG. 2A is operation diagram of a variable resistance element.
Figure 2B:
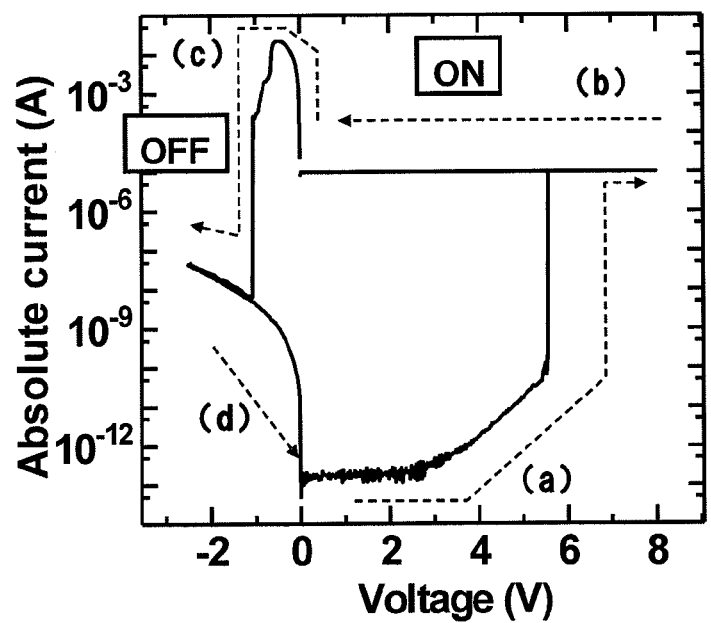
FIG. 2B is a current-voltage graph of a variable resistance element.
Figure 3:
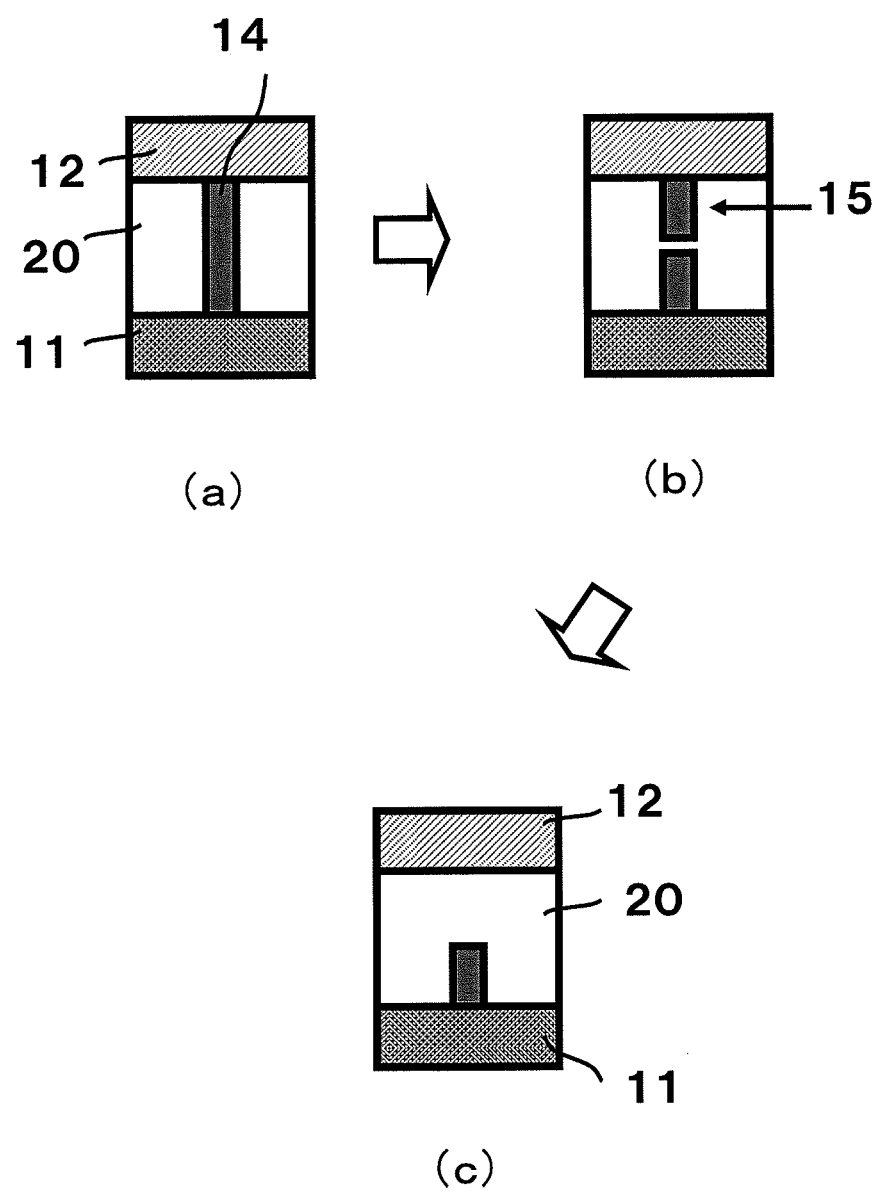
FIG. 3 shows schematic diagrams indicating a problem of a variable resistance element according to a related art.
Figure 4:
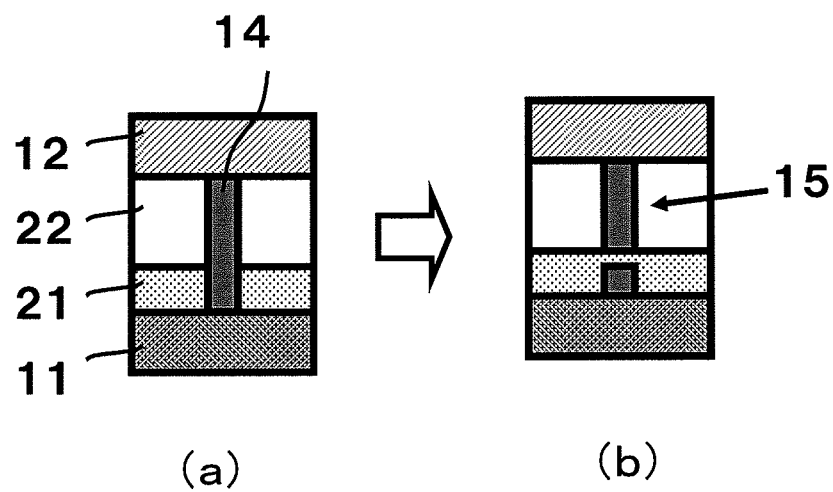
FIG. 4 shows other schematic diagrams indicating a problem of a variable resistance element according to a related art.
Figure 4:
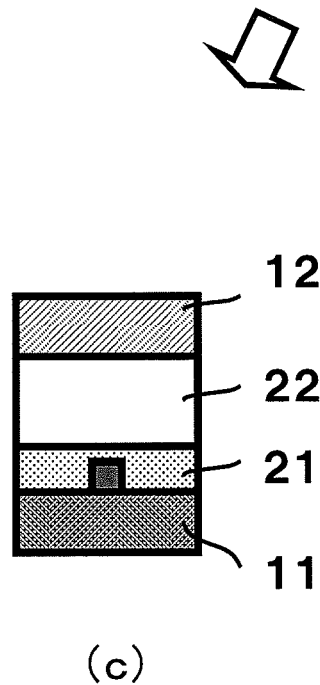
Figure 5:
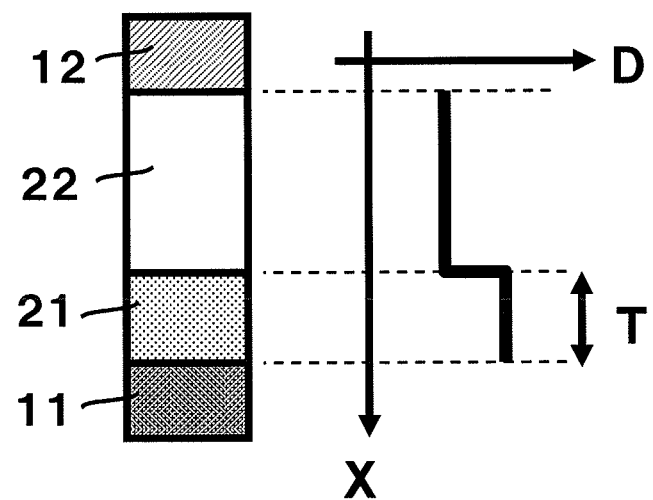
FIG. 5 is a schematic diagram indicating a problem of a variable resistance element according to a related art.

According to the exemplary embodiment, the only maximum point of the diffusion coefficient in the ion conducting layer 23 is determined in the thickness direction of the ion conducting layer and its position coincides with the position where the ion conducting layer 23 is in contact with the first electrode 11 (FIG. 6). The position where the bridged metal is broken on the transition from the on state to the off state can be limited to the part, closest to the first electrode 11, of the ion conducting layer 23, which is a most desirable position as the broken position, and the variation of the off state and deterioration of the insulating resistance can be restrained than the conventional structure illustrated in FIG. 5.

EXAMPLES

Example 1

As illustrated in FIG. 6, a variable resistance element according to Example 1 was formed from a first electrode 11 that serves as a source of a metal ion, a second electrode 12 that is less ionizable than the first electrode 11, and an ion conducting layer 23 that was disposed between the first electrode 11 and the second electrode 12 and that was capable of conducting the metal ion, and a diffusion coefficient in the ion conducting layer 23 was varied. In Example 1, a material of the first electrode 11 was copper, a material of the second electrode 12 was platinum, a material of the ion conducting layer 23 was tantalum oxide ($Ta_2O_5$).

Figure 7:
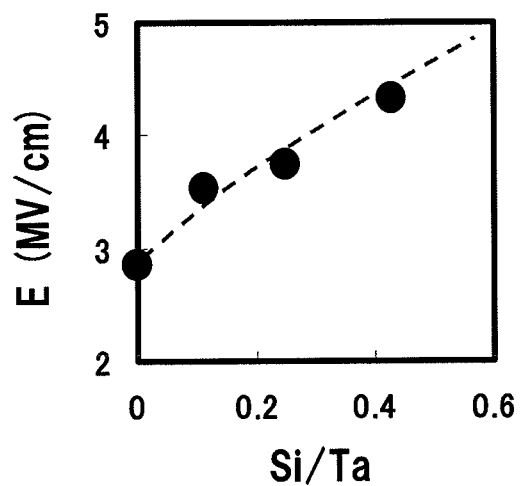
FIG. 7 is a graph indicating a relation between an impurity concentration (Si/Ta) and a diffusion coefficient (E).

In order to make a gradient of the diffusion coefficient of the copper ion in tantalum oxide, an additive amount of silicon (Si) introduced into tantalum oxide was adjusted. The relationship between the additive amount of silicon and diffusibility of the copper ion has been examined in advance by forming a variable resistance element in which silicon is homogeneously added to tantalum oxide. FIG. 7 shows a relation between a Si/Ta ratio and electric field intensity for the transition from the on state to the off state. The lower a positive applied voltage (electric field intensity) to the first electrode 11 which is necessary to diffuse copper for the transition from the on state to the off state is, the higher the diffusion coefficient is. Shown in FIG. 7, it is found that, by reducing the additive amount of silicon, copper becomes easy to be diffused. Accordingly, the diffusion coefficient in the ion conducting layer 23 was increased by gradually reducing the additive amount of silicon in tantalum oxide, which serves as the ion conducting layer 23, toward the first electrode side from the second electrode side.

Next, a method of manufacturing the variable resistance element according to Example 1 will be explained. A co-sputtering method was used to form tantalum oxide to which silicon was added. By providing two sputtering targets, which are silicon oxide ($SiO_2$) and tantalum oxide ($Ta_2O_5$), in a chamber and adjusting power to input a supplying rate from two sputtering sources to a deposition layer into each sputtering source, gas pressure in the chamber, distances from the targets or an open time of a selective shutter, the amount of silicon included in tantalum oxide can be adjusted.

The maximum point of the diffusion coefficient of copper in tantalum oxide in which the additive amount of silicon was reduced toward the first electrode from the second electrode side coincided with a point where tantalum oxide (the ion conducting layer 23) was in contact with the copper electrode which was the first electrode 11 (FIG. 6). Therefore, the position where the bridged metal is broken on the transition from the on state to the off state can be limited to a part, closest to the copper electrode 11, of tantalum oxide which is the ion conducting layer 23, which part is the most desirable position as the broken position, and the variation of the off state and the deterioration of the insulating resistance can be restrained than the simple two-layered structure illustrated in FIG. 5.

Example 2

Next, Example 2 will be explained. As illustrated in FIG. 6, a variable resistance element according to Example 2 was also formed from a first electrode 11 that served as a source of a metal ion, a second electrode 12 that was less ionizable than the first electrode 11, and an ion conducting layer 23 that was disposed between the first electrode 11 and the second electrode 12 and that was capable of conducting the metal ion. In Example 2, a material of the first electrode 11 was copper, a material of the second electrode 12 was platinum, and a material of the ion conducting layer 23 was tantalum oxide ($Ta_2O_5$).

Figure 8:
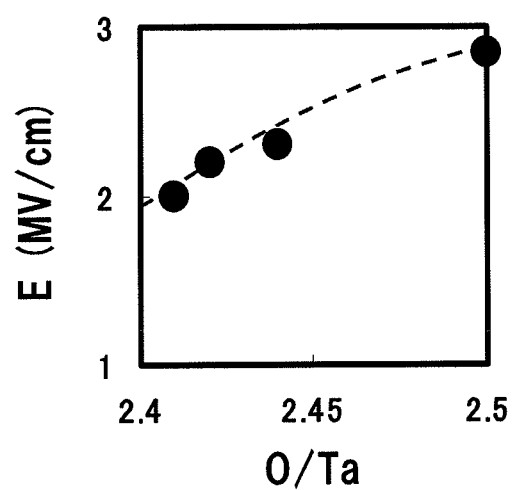
FIG. 8 is a graph indicating a relation between an oxygen concentration and a diffusion coefficient (E).

In order to make a gradient of the diffusion coefficient of the copper ion in tantalum oxide, in Example 2, a composition ratio of oxygen to tantalum in tantalum oxide was adjusted. The relationship between the composition ratio and diffusibility of the copper ion has been examined in advance by forming a variable resistance element of tantalum oxide having a certain composition ratio. FIG. 8 shows a relation between a O/Ta ratio and electric field intensity for the transition from the on state to the off state. The lower a positive applied voltage (electric field intensity) to the first electrode 11 which is necessary to diffuse copper for the transition from the on state to the off state is, the higher the diffusion coefficient is. Shown in FIG. 8, it is found that, by reducing the oxygen concentration, copper becomes easy to be diffused. Accordingly, the diffusion coefficient in the ion conducting layer was increased by gradually reducing the amount of oxygen in tantalum oxide, which is the ion conducting layer 23, toward the first electrode from the second electrode side.

Next, a method of manufacturing the variable resistance element according to Example 2 will be explained. The reactive sputtering was used to form the layer of tantalum oxide in which the composition ratio was varied. By varying a ratio of oxygen to argon in a chamber when a target of tantalum oxide ($Ta_2O_5$) was sputtered, the composition ratio of the formed layer of tantalum oxide was varied. Alternatively, by applying a plasma treatment after the deposition of tantalum oxide, the oxygen concentration of tantalum oxide may be varied. In this case, when exposed to plasma under an oxidation atmosphere including rich active oxygen, the closer to a surface, the greater the oxygen concentration becomes, and, when exposed to the plasma under a reduction atmosphere such as active hydrogen, the closer to the surface, the less the oxygen concentration becomes.

The maximum point of the diffusion coefficient of copper in tantalum oxide in which the oxygen amount was reduced toward the first electrode from the second electrode side became a point where tantalum oxide (the ion conducting layer 23) was in contact with the copper electrode which was the first electrode 11 (FIG. 6). Therefore, the position where the bridged metal is broken on the transition from the on state to the off state can be limited to a part, closest to the copper electrode 11, of tantalum oxide which is the ion conducting layer 23, which is the most desirable position as the broken position, and the variation of the off state and the deterioration of the insulating resistance (brake down resistance) can be restrained as compared to the simple two-layered structure illustrated in FIG. 5.

Figure 9:
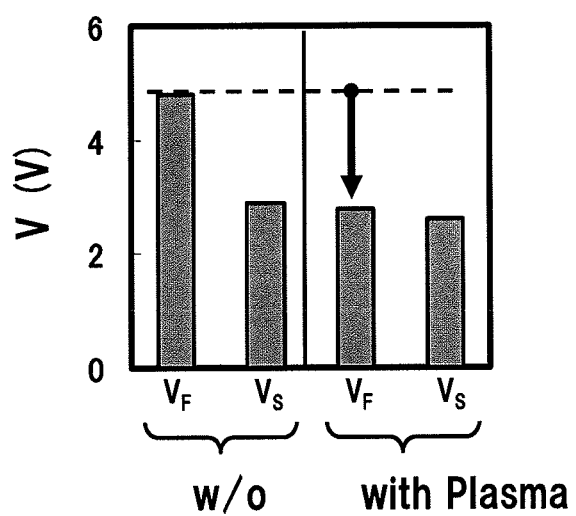
FIG. 9 is a graph indicating a relation between a forming voltage (V) and a setting voltage.

If the plasma treatment is applied after tantalum oxide is deposited on the copper electrode that is the first electrode 11, an effect that the voltage necessary for initial switching just after manufacturing (especially, called "forming voltage Vf") is reduced can be obtained. In an ordinary variable resistance element, initial (first) operation voltage Vf is much higher than the voltage Vs from the off state to the on state at the second time, as shown on a left side of FIG. 9. If the ion conducting layer is exposed to the plasma atmosphere, voltage is applied between (across) the layers, and therefore the same effect as the case of forming, in which voltage is applied after the formation of the element, can be obtained in the process. As shown in FIG. 9, since the forming voltage Vf becomes almost similar to the setting voltage Vs by the plasma treatment, two power supplies for the forming and the setting are unnecessary, and therefore the peripheral circuit can be made smaller.

Example 3

As illustrated in FIG. 6, a variable resistance element according to Example 3 was also formed from a first electrode 11 that served as a source of a metal ion, a second electrode 12 that was less ionizable than the first electrode 11, and an ion conducting layer 23 that was disposed between the first electrode 11 and the second electrode 12 and that was capable of conducting the metal ion. In Example 3, a material of the first electrode 11 was copper, a material of the second electrode 12 was platinum, and a material of the ion conducting layer 23 was tantalum oxynitride (TaON).

Figure 10:
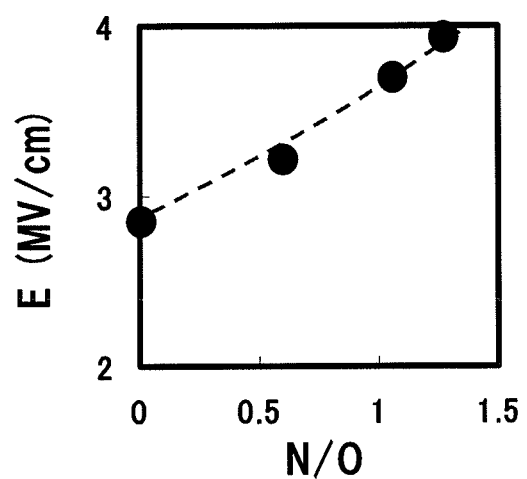
FIG. 10 is a graph indicating a relation between a concentration ratio of nitrogen to oxygen (N/O) and a diffusion coefficient.

In order to make a gradient of the diffusion coefficient of the copper ion in tantalum oxynitride, a composition ratio of nitrogen to oxygen included in tantalum oxynitride was adjusted. The relationship between the concentration ratio of oxygen and nitrogen and diffusibility of the copper ion has been examined in advance by forming a variable resistance element of tantalum oxynitride having a certain concentration ratio. FIG. 10 shows a relation between a N/O ratio and electric field intensity for the transition from the on state to the off state. The lower a positive applied voltage (electric field intensity) to the first electrode 11 which is necessary to diffuse copper for the transition from the on state to the off state is, the higher the diffusion coefficient is. Shown in FIG. 10, it is found that, by reducing the proportion of the nitrogen amount, copper becomes easy to be diffused. Accordingly, the diffusion coefficient in the ion conducting layer was increased by gradually reducing the amount of nitrogen in tantalum oxynitride toward the first electrode from the second electrode side.

Next, a method of manufacturing the variable resistance element according to Example 3 will be explained. The reactive sputtering was used to form the layer of tantalum oxynitride in which the concentration ratio of nitrogen and oxygen was varied. By varying a ratio of oxygen and nitrogen in a chamber when a tantalum target is sputtered, the proportion of oxygen and nitrogen in the formed layer of tantalum oxynitride was varied. Alternatively, by applying a nitrogen plasma treatment after the deposition of tantalum oxide, oxygen of tantalum oxide may be replaced by nitrogen. If exposed to the nitrogen plasma, the closer to a surface of tantalum oxide, the greater the nitrogen concentration becomes. On the contrary, by applying an oxygen plasma treatment after deposition of tantalum nitride, nitrogen of tantalum nitride may be replaced by oxygen.

Figure 11:
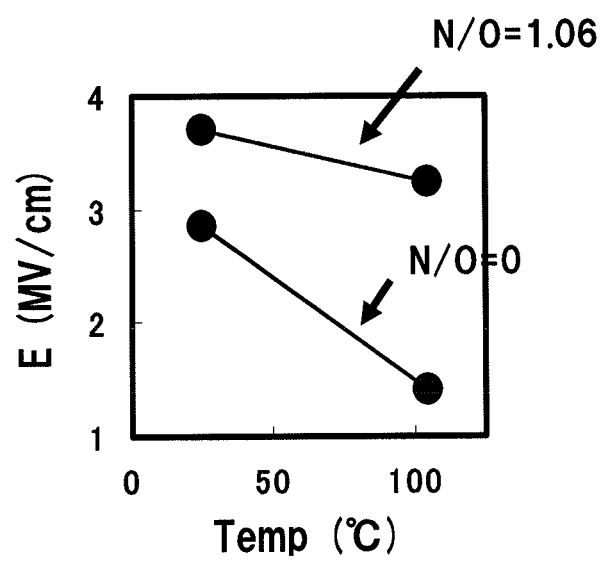
FIG. 11 is a graph indicating temperature dependence of a diffusion coefficient (E).

The temperature dependence of the voltage (electric field intensity) necessary for the transition from the off state to the on state (or the temperature dependence of the diffusion coefficient) varies according to the proportion of oxygen and nitrogen shown in FIG. 11, and the higher the temperature becomes, the greater the difference between the diffusion coefficients becomes. Accordingly, the variable resistance element may be operated under a condition that the temperature of the element is raised to increase the gradient of the diffusion coefficient.

The maximum point of the diffusion coefficient of copper in tantalum oxynitride in which the nitrogen amount was gradually reduced toward the first electrode from the second electrode side became a point where tantalum oxynitride was in contact with the copper electrode which was the first electrode 11 (FIG. 6). Therefore, the position where the bridged metal is broken on the transition from the on state to the off state can be limited to a part, closest to the copper electrode 11, of tantalum oxynitride which is the ion conducting layer 23, and which part is the most desirable position as the broken position, and the variation of the off state and the deterioration of the insulating resistance can be restrained as compared to the simple two-layered structure illustrated in FIG. 5.

If the plasma treatment is applied after tantalum oxide (oxynitride) is deposited on the copper electrode that is the first electrode 11, an effect that voltage necessary for initial switching just 630 after manufacturing (especially, called "forming voltage Vf") is reduced can be also obtained (FIG. 9).

By performing the rewriting operation at higher temperature that makes the gradient of the diffusion coefficient larger and performing the reading operation of the resistance, in which low voltage is applied, at lower temperature that makes the diffusion coefficient and the gradient of the diffusion coefficient smaller (not changing the resistance during a relatively long time), a writing error on the reading time can be prevented.

Although the present invention has been explained based on the above exemplary embodiments and examples, the present invention is not limited to only the structures of the above exemplary embodiments and examples and may include variable modifications and/or corrections that could be made within the present invention by a skilled person in the art The disclosures of the above Patent Documents and Non-Patent Documents are incorporated herein in their entirety by reference thereto. Within the scope of the entire disclosure (including claims and drawings) and based on the basic technical idea, the exemplary embodiment(s) and example(s) may be changed or modified. Within the scope of the claims, any combination and/or selection of the disclosed and/or claimed elements may be available.

EXPLANATIONS OF SYMBOLS

11 First electrode
12 Second electrode
13 Metal ion(s)
14 Metal bridge
15 Recoverable part (of Metal bridge)
20 Ion conducting layer
21 First ion conducting layer
22 Second ion conducting layer
23 Ion conducting layer in which diffusion coefficient has gradient

What is claimed is:

1. A variable resistance element, comprising:
a first electrode that serves as a source of a metal ion(s);
a second electrode that is less ionizable than said first electrode; and
an ion conducting layer that is disposed between said first electrode and said second electrode and is capable of conducting said metal ion; wherein
said ion conducting layer includes a first region which has a first diffusion coefficient successively increasing toward said first electrode up to contacting said first electrode, said first region being disposed adjacent to said first electrode, and
said ion conducting layer has a single maximum diffusion coefficient at a boundary with said first electrode,
said ion conducting layer further includes a second region which has a second diffusion coefficient that is constant;
said second region is formed between said first region and said second electrode; and
said second diffusion coefficient in said second region is equal to or less than a minimum value of said first diffusion coefficient in said first region.

2. The variable resistance element according to claim 1, wherein
said ion conducting layer comprises a compound(s) including two or more elements; and
said first region having a gradient of said first diffusion coefficient is formed by varying a composition ratio of said two or more elements in a vertical direction of the layer, that is, in a direction across said first electrode and said second electrode.

3. The variable resistance element according to claim 2, wherein
said compound(s) including two or more elements is (are) composed of a metal, and nitrogen and/or a chalcogen element(s) that belongs to group 16 of a periodic table.

4. The variable resistance element according to claim 3, wherein said ion conducting layer comprises metal oxide or metal oxynitride.

5. The variable resistance element according to claim 4, wherein said ion conducting layer comprises tantalum oxide or tantalum oxynitride.

6. A variable resistance element, comprising:
a first electrode that serves as a source of a metal ion(s);
a second electrode that is less ionizable than said first electrode; and
an ion conducting layer that is disposed between said first electrode and said second electrode and is capable of conducting said metal ion; wherein
said ion conducting layer includes a first region which has a first diffusion coefficient successively increasing toward said first electrode up to contacting said first electrode, said first region being disposed adjacent to said first electrode, wherein
said ion conducting layer further includes a second region which has a second diffusion coefficient that is constant;
said second region is formed between said first region and said second electrode; and
said second diffusion coefficient in said second region is equal to or less than a minimum value of said first diffusion coefficient in said first region.

7. A variable resistance element, comprising:
a first electrode that serves as a source of a metal ion(s);
a second electrode that is less ionizable than said first electrode; and
an ion conducting layer that is disposed between said first electrode and said second electrode and is capable of conducting said metal ion; wherein
said ion conducting layer includes a first region which has a first diffusion coefficient successively increasing toward said first electrode up to contacting said first electrode, said first region being disposed adjacent to said first electrode, wherein
said ion conducting layer includes impurity; and
said first region having a gradient of said first diffusion coefficient is formed by varying an amount of said impurity in a vertical direction of the layer, that is, in a direction across said first electrode and said second electrode.

8. The variable resistance element according to claim 7, wherein
said ion conducting layer comprises tantalum oxide or tantalum oxynitride including silicon as said impurity.

9. A variable resistance element, comprising:
a first electrode that serves as a source of a metal ion(s);
a second electrode that is less ionizable than said first electrode; and
an ion conducting layer that is disposed between said first electrode and said second electrode and is capable of conducting said metal ion; wherein
said ion conducting layer includes a first region which has a first diffusion coefficient successively increasing toward said first electrode up to contacting said first electrode, said first region being disposed adjacent to said first electrode, wherein
said ion conducting layer has a first temperature dependence of the diffusion coefficient on a first side adjacent to said first electrode greater than a second temperature dependence of the diffusion coefficient on a second side adjacent to said second electrode.

10. The variable resistance element according to claim 9, wherein
an operation of transition from a high resistance state to a low resistance state is performed in a temperature range in which said ion conducting layer has a first gradient of the diffusion coefficient on said first side adjacent to said first electrode greater than a second gradient of the diffusion coefficient on said second side adjacent to said second electrode.

\* \* \* \* \*

UNITED STATES PATENT AND TRADEMARK OFFICE
CERTIFICATE OF CORRECTION

PATENT NO. : 8,878,153 B2  
APPLICATION NO. : 13/514385  
DATED : November 4, 2014  
INVENTOR(S) : Yukihide Tsuji Page 1 of 1

It is certified that error appears in the above-identified patent and that said Letters Patent is hereby corrected as shown below:

In the Specification

Column 1, Line 51: After "ions" insert -- 13 --.

Column 10, Line 57: Delete "630 after" and insert -- after --.

Signed and Sealed this

Fourth Day of August, 2015

Michelle K. Lee
*Director of the United States Patent and Trademark Office*